United States Patent [19]

Furutani et al.

[11] Patent Number: 5,229,732
[45] Date of Patent: Jul. 20, 1993

[54] HIGH FREQUENCY AMPLIFIER HAVING STABLE AMPLIFICATION OPERATION

[75] Inventors: Nagahisa Furutani, Kawasaki; Kazuhiro Matsumoto, Isehara; Yutaka Hirano, Atsugi, all of Japan

[73] Assignee: Fujitsu Limited, Kawasaki, Japan

[21] Appl. No.: 879,109

[22] Filed: May 4, 1992

Related U.S. Application Data

[63] Continuation of Ser. No. 641,915, Jan. 16, 1991, abandoned.

[30] Foreign Application Priority Data

Jan. 16, 1990 [JP] Japan .................................. 2-006738

[51] Int. Cl.$^5$ .......................................... H03F 3/193
[52] U.S. Cl. ............................ 330/277; 330/296; 330/306
[58] Field of Search ..................... 330/277, 296, 306

[56] References Cited

U.S. PATENT DOCUMENTS

| | | | |
|---|---|---|---|
| 3,217,265 | 11/1965 | Lungo | 330/306 X |
| 3,443,239 | 3/1981 | Schmitt | 330/290 |
| 4,028,629 | 6/1977 | Ringland | 330/2 |
| 4,107,621 | 8/1978 | Furutani et al. | 330/296 |
| 4,306,200 | 12/1981 | Takayama | 330/306 X |
| 4,379,269 | 5/1983 | Ijichi | 330/277 |

FOREIGN PATENT DOCUMENTS 2936606  3/1981  Fed. Rep. of Germany .
56-73911  6/1981  Japan .

OTHER PUBLICATIONS

Horwitz, "Design Wideband UHF Power Amplifiers" Electronic Design 11, May 24, 1969, pp. 72-77.

Primary Examiner—James B. Mullins
Attorney, Agent, or Firm—Staas & Halsey

[57] ABSTRACT

A selection unit, which is provided between an input matching unit and a high frequency amplification unit, is used to select a specific high frequency band to be amplified by the high frequency amplification unit from high frequency signals input from an input terminal. Further, an attenuation unit, which is provided between an input of the high frequency amplification unit and ground, is used to attenuate the input high frequency signals except for the specific high frequency band. Therefore, the specific high frequency band of the input high frequency signals is transferred from the input terminal to the high frequency amplification unit through the selection unit with a small loss, and the input high frequency signals except for the specific high frequency band are attenuated by the attenuation unit. Further, not only can stability of the high frequency amplification unit in the specific high frequency band used for the amplifier be realized, but stability of the high frequency amplification unit in other frequency bands except for the specific high frequency band can be also realized. Consequently, the high frequency amplifier does not oscillate and is not damaged.

3 Claims, 11 Drawing Sheets

HIGH FREQUENCY AMPLIFIER HAVING STABLE AMPLIFICATION OPERATION

This application is a continuation of application Ser. No. 07/641,915, filed Jan. 16, 1991, now abandoned.

BACKGROUND OF THE INVENTION

1. Field of the Invention

The present invention relates to a high frequency amplifier, more particularly, to a high frequency amplifier having a high frequency transistor used for a wireless installation, a portable telephone, and the like.

2. Description of the Related Art

Recently, a high frequency transistor such as a silicon (Si) transistor or a gallium arsenide (GaAs) field effect transistor (FET) is used for an amplifier element of a communication device in response to the requirements for high performance and miniaturization. A high frequency amplifier device using the above amplifier elements is constituted by connecting a plurality of single high frequency amplifiers for a multistage amplification, so that a required amount of amplification is obtained.

The (single) high frequency amplifier is, for example, constituted by an amplifier element (transistor), an input matching circuit, an output matching circuit, a bias supply circuit, and the like. These circuits are sufficiently matched (generally, 50 Ω) in a specific high frequency band used for the high frequency amplifier device. Nevertheless, in the other frequency bands except for the specific high frequency band, the matching characteristics of the circuits are not sufficient, that is, the matching characteristics thereof are not specified at 50 Ω. Therefore, when connecting a plurality of high frequency amplifiers each having a single transistor to constitute a high frequency amplifier device by a multistage amplification, an input impedance or an output impedance of the high frequency amplifier device including a plurality of high frequency amplifiers may be positioned in an unstable frequency area due to the physical property of the transistor, so that stable amplification by each of the high frequency amplifiers may be adversely affected and the high frequency amplifier device begin to oscillate.

SUMMARY OF THE INVENTION

It is an object of the present invention to provide a high frequency amplifier having stable amplification at high frequency signals.

According to the present invention, there is provided a high frequency amplifier comprising: an input terminal; an output terminal; a high frequency amplification unit for amplifying a specific high frequency band of high frequency signals input from the input terminal; a bias supply unit, connected to the high frequency amplification unit, for applying a bias potential to the high frequency amplification unit; a selection unit, connected between the input terminal and the high frequency amplification unit, for selecting the specific high frequency band to be amplified by the high frequency amplification unit from the input high frequency signals; and an attenuation unit connected between an input of the high frequency amplification unit and ground, for attenuating the input high frequency signals except for the specific high frequency band.

According to the present invention, there is also provided a high frequency amplifier comprising: an input terminal; an output terminal; a high frequency amplification unit for amplifying a specific high frequency band of high frequency signals input from the input terminal; an input matching unit for matching impedances between the input terminal and the high frequency amplification unit; an output matching unit for matching impedances between the high frequency amplification unit and the output terminal; a bias supply unit, connected to the high frequency amplification unit, for applying a bias potential to the high frequency amplification unit; a selection unit, connected between the input matching unit and the high frequency amplification unit, for selecting the specific high frequency band to be amplified by the high frequency amplification unit from the input high frequency signals; and an attenuation unit connected between an input of the high frequency amplification unit and ground, for attenuating the input high frequency signals except for the specific high frequency band.

The high frequency amplification unit may comprise a field effect transistor having a gate, source, and drain; the gate of the field effect transistor may be connected to an output of the selection unit, the source may be connected to ground, and the drain may be connected to an input of the output matching unit. Further, the high frequency amplification unit may comprise a bipolar transistor having a base, emitter, and collector; the base of the bipolar transistor may be connected to an output of the selection unit, the emitter may be connected to ground, and the collector may be connected to an input of the output matching unit.

The selection unit may comprise a series resonant circuit for selecting the specific high frequency band in accordance with a resonant frequency of the series resonant circuit. This series resonant circuit may include a first high frequency coil and a first capacitor, and the first high frequency coil and the first capacitor may be connected in series.

The bias supply unit may comprise a second resistor, a second and third high frequency coils, and a second and fourth capacitors; one end of the second resistor may be connected to the input of the high frequency amplification unit, the other end of the second resistor may be connected to one end of the second coil and ground through a third capacitor of the attenuation unit, the one end of the high frequency coil may be connected to an output of the input matching unit through a first resistor of the attenuation unit, the other end of the second coil may be connected to a low potential bias terminal and to ground through the second capacitor, one end of the third frequency coil may be connected to an output of the high frequency amplification unit, and the other end of the third frequency coil may be connected to a high potential bias terminal and to ground through the fourth capacitor. The bias supply unit may further comprise a fourth resistor and a fifth capacitor; the fourth resistor and the fifth capacitor may be connected in series and provided between the high potential bias terminal and ground.

The attenuation unit may comprise a first and second resistors, a second high frequency coil and a third capacitor; the first resistor and the second high frequency coil may be connected in series and provided between an output of the input matching unit and a low potential bias terminal of the bias supply unit, and the second resistor and the third capacitor may be connected in series and provided between the input of the high frequency amplification unit and ground. The second high frequency coil and the second resistor may be included in both the bias supply unit and the attenuation unit.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the prior art will be first explained with reference to FIGS. 1 to 4.

Figure 1:
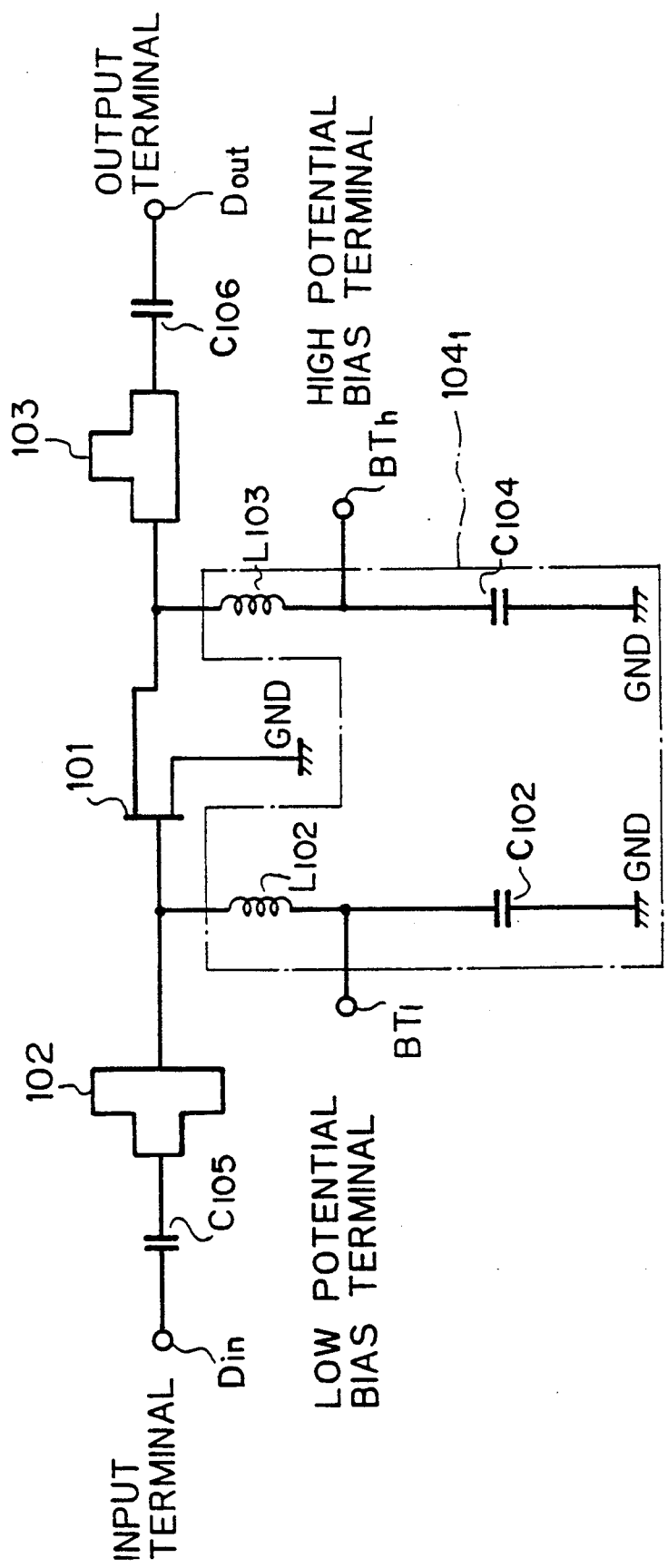
FIGS. 1 to 4 are circuit diagrams illustrating examples of high frequency amplifiers according to the prior art.

FIG. 1 is a circuit diagram illustrating an example of a high frequency amplifier according to the prior art. As shown in FIG. 1, the high frequency amplifier comprises a field effect transistor (FET) 101, an input matching circuit 102, an output matching circuit 103, and a bias supply circuit $104_1$.

The FET 101 is used to amplify high frequency signals input from an input terminal $D_{in}$ through the input matching circuit 102 and to output them to an output terminal $D_{out}$ through the output matching circuit 103. Namely, the gate of the FET 101 is connected to the output of the input matching circuit 102, the drain of the FET 101 is connected to the input of the output matching circuit 103, and the source of the FET 101 is connected to ground GND.

An input of the input matching circuit 102 is connected to the input terminal $D_{in}$ through a coupling capacitor $C_{105}$, and the input matching circuit 102 is used to match impedances between the input terminal $D_{in}$ and the FET 101. The output of the output matching circuit 103 is connected to the output terminal $D_{out}$ through a coupling capacitor $C_{106}$, and the output matching circuit 103 is used to match impedances between the output terminal $D_{out}$ and the FET 101.

The bias supply circuit $104_1$ is constituted by two high frequency band pass capacitors $C_{102}$, $C_{104}$ and two high frequency coils $L_{102}$, $L_{103}$. One end of the high frequency coil $L_{102}$ is connected to the gate of the FET 101, the other end of the coil $L_{102}$ is connected to ground through the capacitor $C_{102}$, and a low potential bias terminal $BT_l$ is connected to the other end of the coil $L_{102}$. Further, one end of the high frequency coil $L_{103}$ is connected to the drain of the FET 101, the other end of the coil $L_{103}$ is connected to ground through the capacitor $C_{104}$, and a high potential bias terminal $BT_h$ is connected to the other end of the coil $L_{103}$. Note, a high potential bias is applied to the FET 101 from the high potential bias terminal $BT_h$, and a low potential bias is applied to the FET 101 from the low potential bias terminal $BT_l$.

When forming a unit amplifier (or a (single) high frequency amplifier) in accordance with the above configuration, and further, when constituting a multistage amplifier (or a high frequency amplifier device) by connecting a plurality of unit amplifiers, impedance matching is carried out at an input portion and an output portion of each of the unit amplifiers in a specific high frequency band used for the multistage amplifier, so that stability of the multistage amplifier can be realized in the specific high frequency band.

Figure 2:
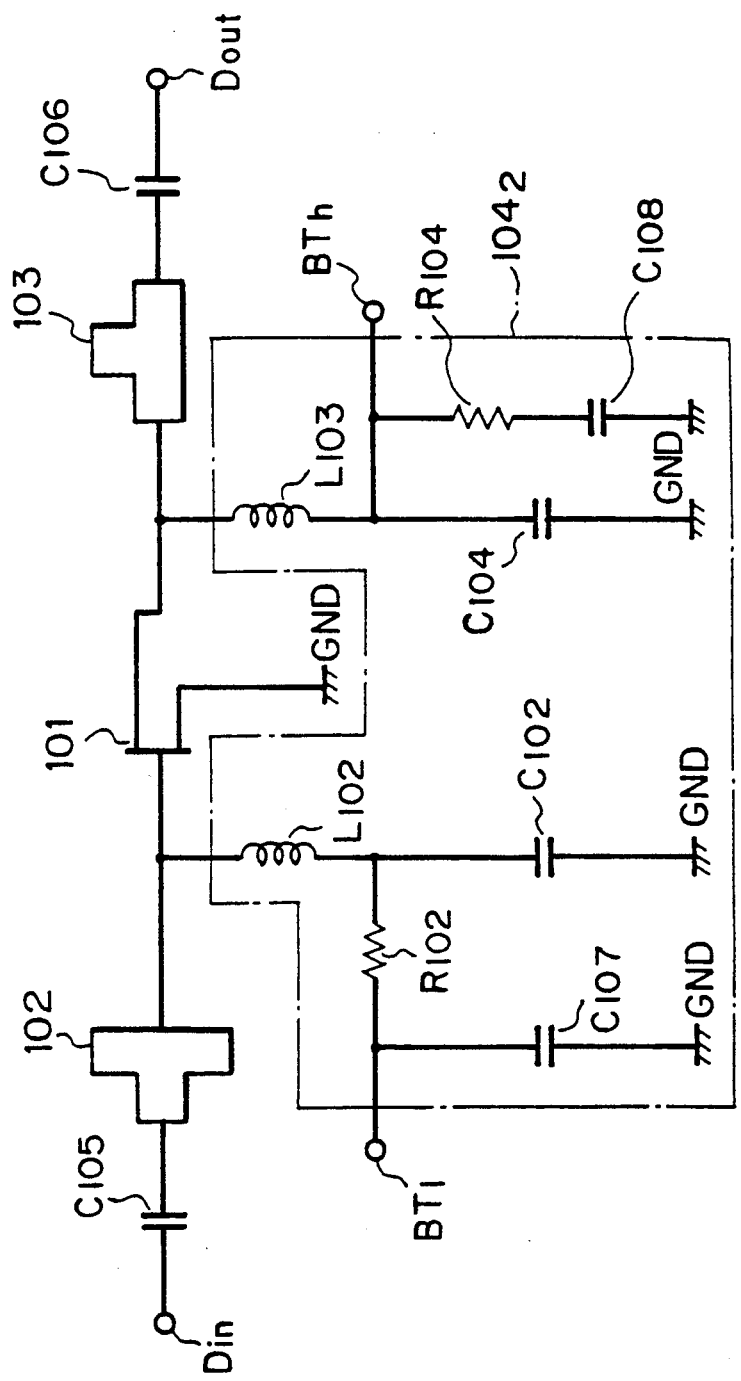
Figure 3:
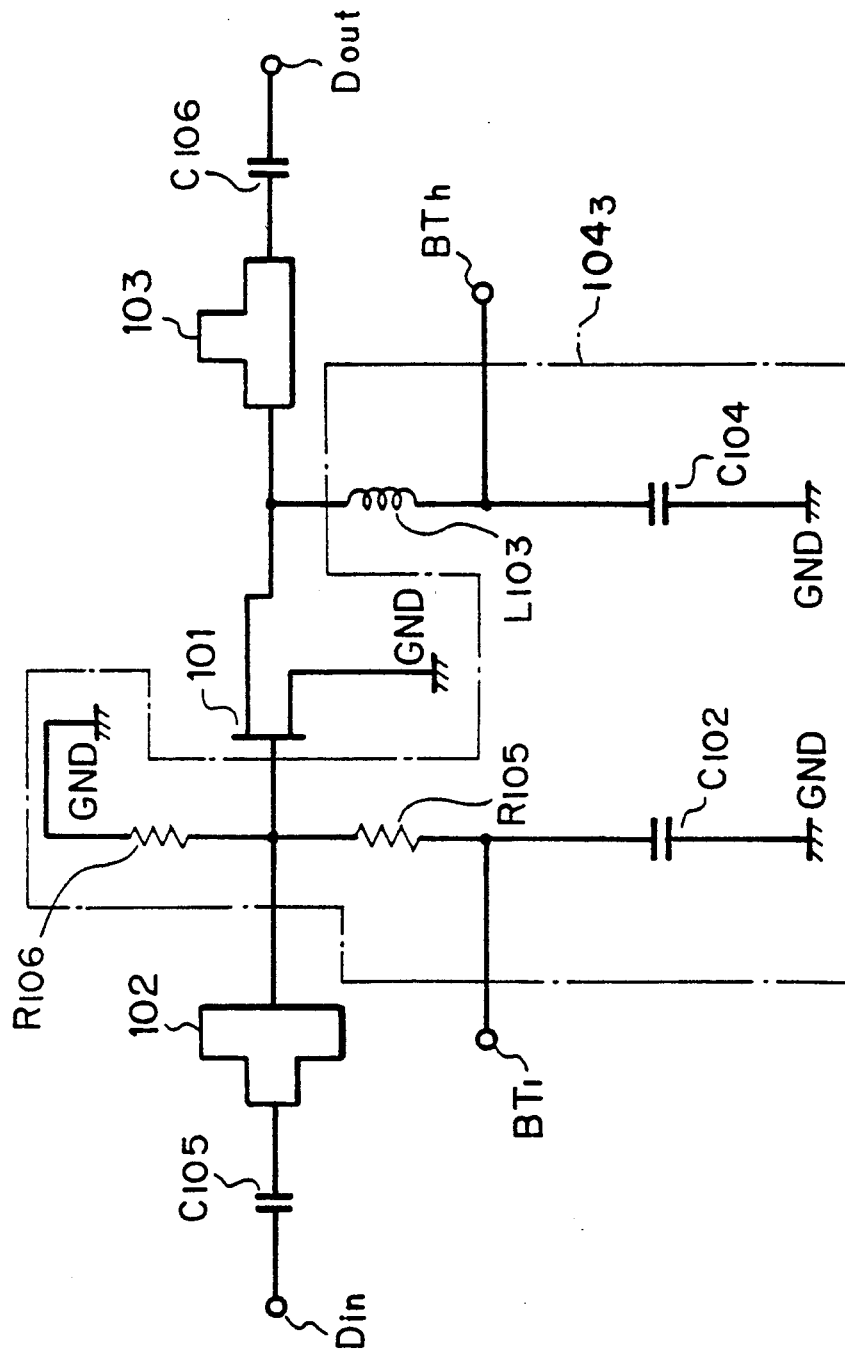
Figure 4:
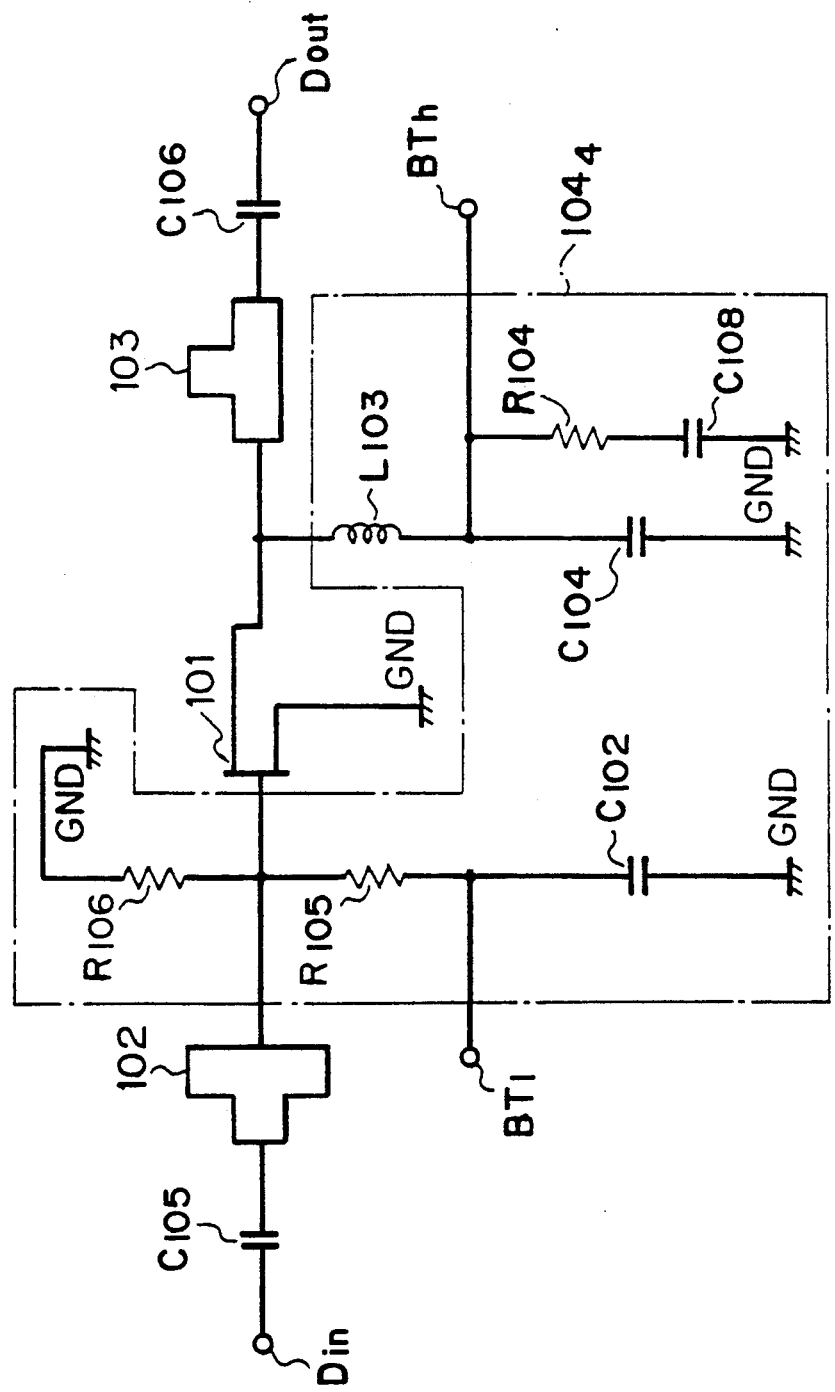

FIGS. 2 to 4 are circuit diagrams illustrating other examples of high frequency amplifiers according to the prior art. Each of the high frequency amplifiers (or unit amplifiers) of the prior art comprises an FET 101, an input matching circuit 102 and an output matching circuit 103, which have the same configuration of that shown in FIG. 1. Further, each of the high frequency amplifiers shown in FIGS. 2 to 4 comprises a bias supply circuit ($104_2$, $104_3$, $104_4$), which is different from that shown in FIG. 1.

A bias supply circuit $104_2$ of the high frequency amplifier shown in FIG. 2 further comprises capacitors $C_{107}$, $C_{108}$ and resistors $R_{103}$, $R_{104}$. The capacitor $C_{107}$ is connected between the low potential bias terminal $BT_l$ and ground GND, and the resistor $R_{103}$ is connected between the low potential bias terminal $BT_l$ and the other end of the high frequency coil $L_{102}$. An end of the resistor $R_{104}$ is connected to the high potential bias terminal $BT_h$, and the other end of the resistor $R_{104}$ is connected to ground GND through the capacitor $C_{108}$. According to the above configuration, in a low frequency range, an impedance of the input terminal $D_{in}$ and an impedance of the output terminal $D_{out}$ in reference to the FET 101 are improved and specified at nearly 50 Ω.

In a bias supply circuit $104_3$ of the high frequency amplifier shown in FIG. 3, a resistor $R_{105}$ is provided instead of the high frequency coil $L_{102}$ of the bias supply circuit $104_1$ shown in FIG. 1, and a resistor $R_{106}$, which is connected between the gate of the FET 101 and ground GND, is provided. In this configuration, a high frequency line is connected to ground GND through the resistor $R_{105}$ and the capacitor $C_{102}$ and also through the resistor $R_{106}$ (whose resistance, for example, is specified at over 600 Ω), at the output of the input matching circuit 102. Note, when the resistance of each of the resistors $R_{105}$ and $R_{106}$ is specified at over 600 Ω, a large frequency band for the gate of the FET or the bias supply circuit can be constituted, but impedance matching in the other frequency bands except for the specific high frequency band used for the high frequency amplifier cannot be improved.

In a bias supply circuit $104_4$ of the high frequency amplifier shown in FIG. 4, a resistor $R_{105}$ is provided instead of the high frequency coil $L_{102}$ in the bias supply circuit $104_2$ shown in FIG. 2, a resistor $R_{106}$, which is connected between the gate of the FET 101 and ground GND, is provided, and the resistor $R_{103}$ and the capacitor $C_{102}$ are omitted from the bias supply circuit $104_2$ shown in FIG. 2. According to the above configuration, impedance matching for a large frequency band at the gate of the FET 101 can be obtained, and the impedance of the output terminal $D_{out}$ in reference to the FET 101 is improved.

In the above described high frequency amplifiers according to the prior art, the following problems have been pointed out. Namely, in the high frequency amplifier shown in FIG. 1, stability of the FET 101 in the specific high frequency band used for the amplifier can be realized, but in other frequency bands except for the specific high frequency band, the impedance matching thereof is not secured. Especially, in a low frequency area, it is a problem that the amplifier may oscillate and the stability of the amplification thereof may be damaged.

Further, in the high frequency amplifier shown in FIG. 2, stability of the FET 1 in the other frequency bands except for the specific high frequency band used for the amplifier can be realized. Nevertheless, the amplifier is formed by an element configuration having a low Q-value, so when the gain of the FET 1 is large and an isolation ($\delta$) is not sufficient, an improvement in impedance at low frequencies is not sufficient, oscillation of the high frequency amplifier may be caused, and stability of the amplification operation thereof may be damaged.

Additionally, in the high frequency amplifiers shown in FIGS. 3 and 4, a resistance value of each of the resistors $R_{105}$ and $R_{106}$ can be specified as a small value, for example, specified as about 100 $\Omega$. Note, when the resistance value of the resistors $R_{105}$ and $R_{106}$ is about 100 $\Omega$, impedance matching in all frequency bands including the specific high frequency band for which the high frequency amplifier is used and other frequency bands except for the specific high frequency band, can be improved. Nevertheless, a high frequency loss in the specific high frequency band of the high frequency amplifier becomes large by using small values for the resistors $R_{105}$ and $R_{106}$. Namely, a loss is caused in all frequency bands including the specific high frequency band, and the gain of the high frequency amplifier becomes small.

Next, the principle of a high frequency amplifier according to the present invention will be explained, with reference to FIG. 5.

Figure 5:
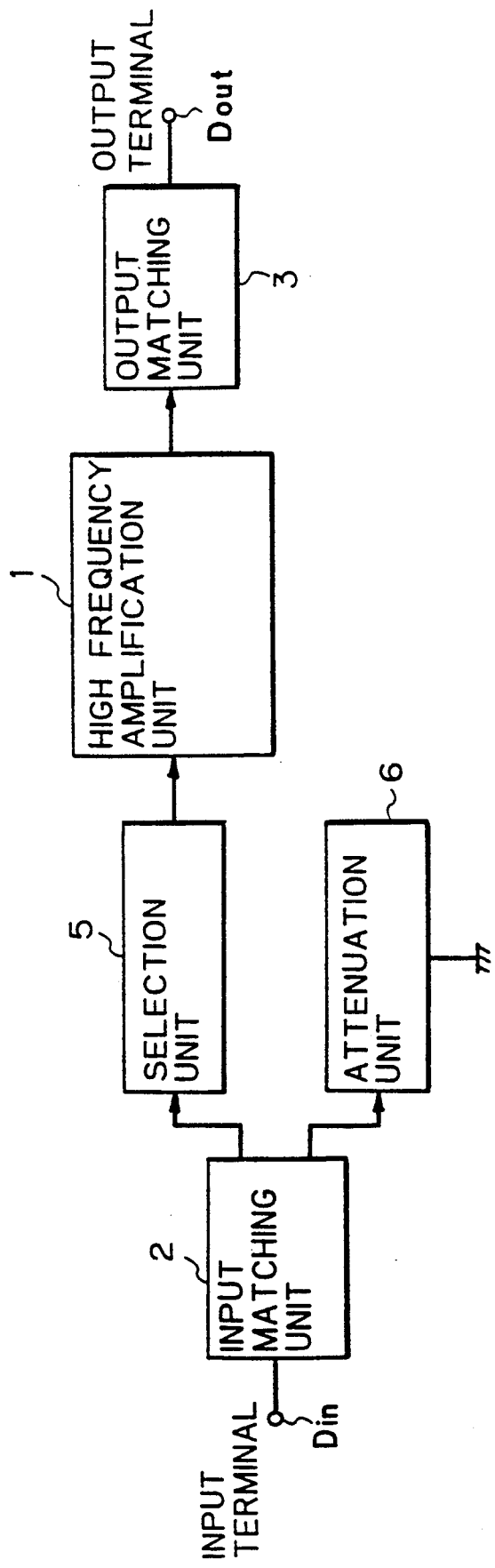
FIG. 5 is a block diagram illustrating a principle of a high frequency amplifier according to the present invention.

FIG. 5 is a block diagram illustrating the principle of a high frequency amplifier according to the present invention. As shown in FIG. 5, a high frequency amplifier comprises a high frequency amplification unit 1, an input matching unit 2, an output matching unit 3, a selection unit 5, and an attenuation unit 6. Note, the high frequency amplifier further comprises a bias supply circuit 4, and some elements of the bias supply circuit 4 are used in the attenuation unit 6.

The high frequency amplification unit 1 is used to amplify a specific range of high frequency signals (specific high frequency band) input from an input terminal $D_{IN}$, and output amplified high frequency signals to the output matching unit 3. The input matching unit 2, which is connected to the input terminal $D_{IN}$, is used to match impedances between the input terminal $D_{IN}$ and the high frequency amplification unit 1. The output matching unit 3, which is connected between the high frequency amplification unit 1 and an output terminal $D_{OUT}$, is used to match impedances between the output terminal $D_{OUT}$ and the high frequency amplification unit 1.

The selection unit 5 is connected between the input matching unit 2 and the high frequency amplification unit 1, or provided at a transmission line, and the selection unit 5 includes a series resonant circuit. This selection unit 5 is used to select the specific high frequency band from the input high frequency signals in response to selection characteristics of the series resonant circuit. Namely, the selection unit 5 is used to pass through the specific high frequency band in accordance with a passband of the selection unit 5.

The attenuation unit 6, which is connected to an output of the input matching unit 2 (or an input of the selection unit 5) and ground GND, is used to attenuate the input high frequency signals except for the specific high frequency band (or the passband of the selection unit 5).

Therefore, the input high frequency signals in the specific high frequency band are transferred from the input terminal $D_{IN}$ to the high frequency amplification unit 1 through the selection unit 5 with a small loss, and the input high frequency signals except for the specific high frequency band are attenuated by the attenuation unit 6. Further, stability of the high frequency amplification unit 1 in the specific high frequency band used for the amplifier can not only be realized, but a stability of the high frequency amplification unit 1 in other frequency bands except for the specific high frequency band can be also realized. Consequently, the high frequency amplifier does not oscillate and it is not damaged.

Below, the preferred embodiments of a high frequency amplifier according to the present invention will be explained, with reference to FIGS. 6 to 11.

Figure 6:
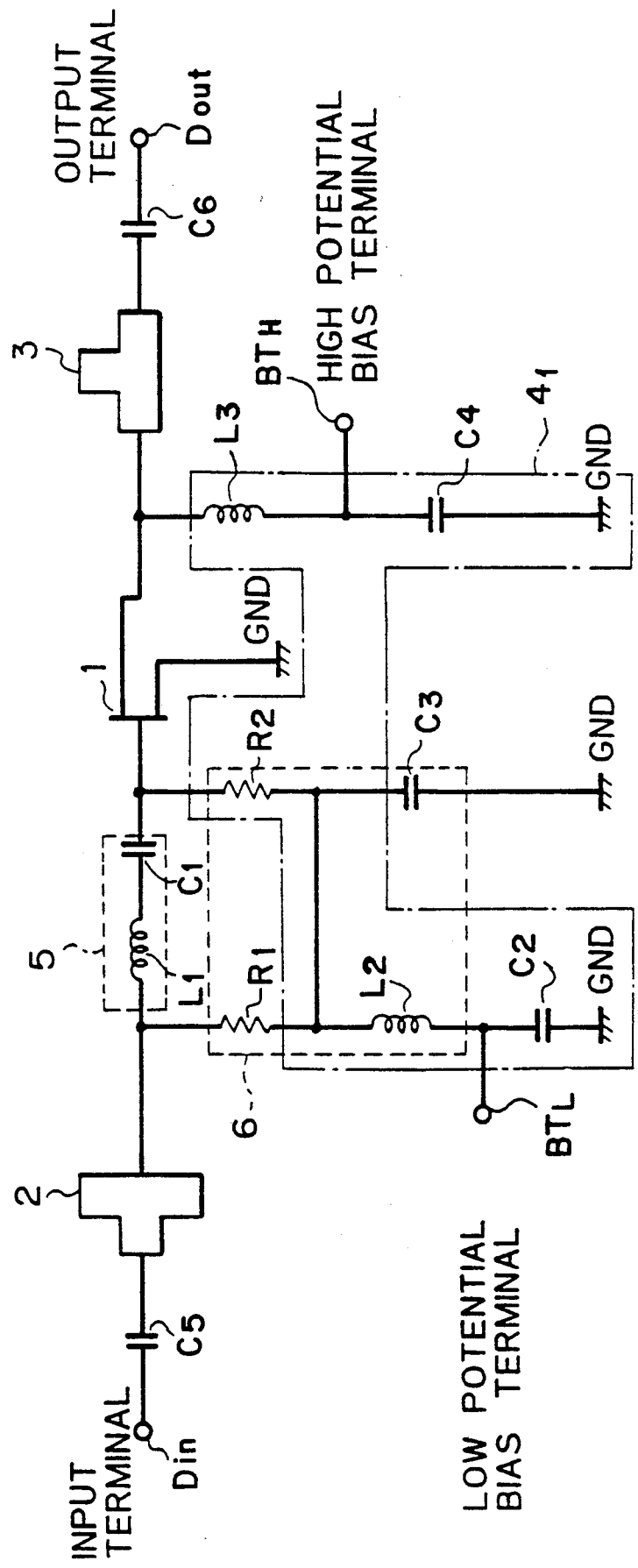
FIG. 6 is a circuit diagram illustrating a first embodiment of a high frequency amplifier according to the present invention.

FIG. 6 is a circuit diagram illustrating a first embodiment of a high frequency amplifier according to the present invention. As shown in FIG. 6, the high frequency amplifier comprises an FET 1, an input matching circuit 2, and an output matching circuit 3, which have the same configurations as the prior art high frequency amplifiers shown in FIGS. 1 to 4.

The FET 1 is used to amplify high frequency signals input from an input terminal $D_{IN}$ through the input matching circuit 2 and to output them to an output terminal $D_{OUT}$ through the output matching circuit 3. Namely, the gate of the FET 1 is connected to the output of the input matching circuit 2, the drain of the FET 1 is connected to an input of the output matching circuit 3, and the source of the FET 1 is connected to ground GND.

The input of the input matching circuit 2 is connected to the input terminal $D_{IN}$ through a coupling capacitor $C_5$, and the input matching circuit 2 is used to match impedances between the input terminal $D_{IN}$ and the FET 1. The output of the output matching circuit 3 is connected to the output terminal $D_{OUT}$ through a coupling capacitor $C_6$, and the output matching circuit 3 is used to match impedances between the output terminal $D_{OUT}$ and the FET 1.

As shown in FIG. 6, the high frequency amplifier of the first embodiment according to the present invention further comprises a bias supply circuit 4, a selection unit 5, and an attenuation unit 6. Note, some elements of the bias supply circuit 4 are used in the attenuation unit 6.

The selection unit 5 comprises a high frequency coil $L_1$ and a capacitor $C_1$, and the high frequency coil $L_1$ and the capacitor $C_1$ are connected between the gate of the FET 1 and the output of the input matching circuit 2 in series. This selection unit 5 (or series resonant circuit) is used to select and transfer a specific range of high frequency signals to be amplified by the FET 1 with a small high frequency loss.

The bias supply circuit $4_1$ comprises two high frequency band pass capacitors $C_2$, $C_4$, two high frequency coils $L_2$, $L_3$, and a resistor $R_2$. Namely, one end of the high frequency coil $L_2$ is connected to the output of the input matching circuit 2 through a resistor $R_1$ of the attenuation unit 6, and the other end of the coil $L_2$ is connected to a low potential bias terminal $BT_L$ and to ground through the capacitor $C_2$. One end of the resistor $R_2$ is connected to the gate of the FET 1, and the other end of the resistor $R_2$ is connected to the one end of the coil $L_2$ and ground GND through a capacitor $C_3$ of the attenuation unit 6. Further, one end of the high frequency coil $L_3$ is connected to the drain of the FET 1, the other end of the coil $L_3$ is connected to a high potential bias terminal $BT_H$ and to ground GND through the capacitor $C_4$. Note, a high potential bias is applied to the FET 1 from the high potential bias terminal $BT_H$, and a low potential bias is applied to the FET 1 from the low potential bias terminal $BT_L$. Namely, direct current bias voltages are applied between the drain-source and the gate-source of the FET 1 by applying a positive voltage to the high potential bias terminal $BT_H$ and a low (or negative) voltage to the low potential bias terminal $BT_L$. Further, the capacitors $C_2$ and $C_4$ are used to electrically isolate a direct current voltage (high potential bias and low potential bias) for driving the FET 1 from ground GND.

The attenuation unit 6 comprises two resistors $R_1$, $R_2$, a high frequency coil $L_2$ and a capacitor $C_3$. Namely, the resistor $R_1$ and the coil $L_2$ are connected in series and provided between the output of the input matching circuit 2 and the low potential bias terminal $BT_L$ (or one end of the capacitor $C_2$). Further, the resistor $R_2$ and the capacitor $C_3$ are connected in series and provided between the gate of the FET 1 and ground GND. Note, the attenuation unit 6 is used to attenuate the input high frequency signals except for the specific high frequency band to be amplified by the FET 1. Furthermore, the high frequency coil $L_2$ and the resistor $R_2$ are included in both the bias supply circuit $4_1$ and the attenuation unit 6.

Next, an operation of the high frequency amplifier according to the first embodiment having the above configuration will be explained.

First, when inputting high frequency signals into the input terminal $D_{IN}$ of the high frequency amplifier, the input high frequency signals are transferred to the input matching circuit 2 through the pass capacitor $C_5$.

This input matching circuit 2 is used to match an impedance $Z_{IN}$ (for example, $Z_{IN}=50 \Omega$) at the input terminal $D_{IN}$ with an impedance $Z_{Tr}$ (for example, $Z_{Tr}=200\Omega$) of the FET 1 and to transfer the input high frequency signals into the selection unit 5.

Namely, the input high frequency signals are input into the series resonant circuit including the high frequency coil $L_1$ and the capacitor $C_1$. This series resonant circuit is used to pass through a specific range of high frequency signals from the input high frequency signals according to a resonant frequency $f_0$ of the series resonant circuit, and the specific range of high frequency signals is input into the gate terminal of the FET 1. Note, the specific range of high frequency signals corresponds to a specific high frequency band to be amplified by the high frequency amplifier. Further, high frequency signals except for the specific range, or the other high frequency bands except for the specific high frequency band are absorbed and attenuated by the attenuation unit 6 including the resistors $R_1$, $R_2$, the high frequency coil $L_2$, and the capacitor $C_3$.

In this high frequency amplifier of the first embodiment, a high potential bias is applied to the FET 1 from the high potential bias terminal $BT_H$, and the low potential bias is applied to the FET 1 from the low potential bias terminal $BT_L$, so that the input high frequency signals of the specific high frequency band are amplified by the FET 1. Note, the capacitors $C_2$ and $C_4$ are used to electrically isolate a direct current voltage for driving the FET 1 from ground GND.

Figure 7:
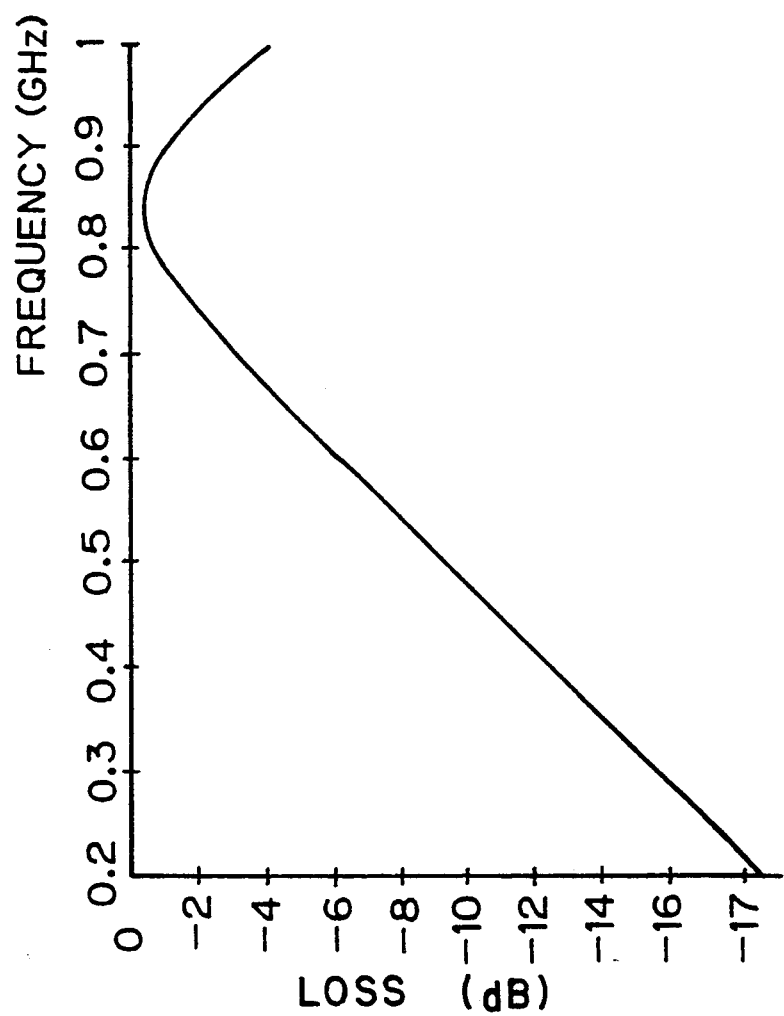
FIG. 7 is a diagram indicating propagation characteristics of a matching improvement unit provided in a high frequency amplifier according to the present invention.

FIG. 7 is a diagram indicating propagation characteristics of a matching improvement unit provided in a high frequency amplifier according to the present invention. Note, the matching improvement unit is constituted by the selection unit 5 and the attenuation unit 6, and thus the matching improvement unit is provided among the input terminal $D_{IN}$, the gate of the FET 1, and ground GND. Further, it is obvious that the matching improvement unit is constituted by two resistors $R_1$, $R_2$, two high frequency coil $L_1$, $L_2$, and three capacitors $C_1$, $C_2$, $C_3$.

As shown in FIG. 7, in the case where a specific high frequency band, which is used for the high frequency amplifier, is specified in a range of 0.8~0.9 GHz, high frequency signals in the specific high frequency band are transferred through the matching improvement unit with a small loss of about 0.3~0.5 dB ($-0.3 \sim -0.5$ dB). Conversely, in the other high frequency bands except for the specific high frequency band, for example, in a high frequency band 0.6~0.7 GHz, a loss of the high frequency signals transferred through the matching improvement unit is about 3.0~6.0 dB ($-3.0 \sim -6.0$ dB). Namely, in the matching improvement unit constituted by the selection unit 5 and the attenuation unit 6, the specific high frequency band used for the high frequency amplifier can be transferred from the input terminal $D_{IN}$ to the high frequency amplification unit 1 with a small loss, and the input high frequency signals except for the specific high frequency band can be largely attenuated.

Figure 8:
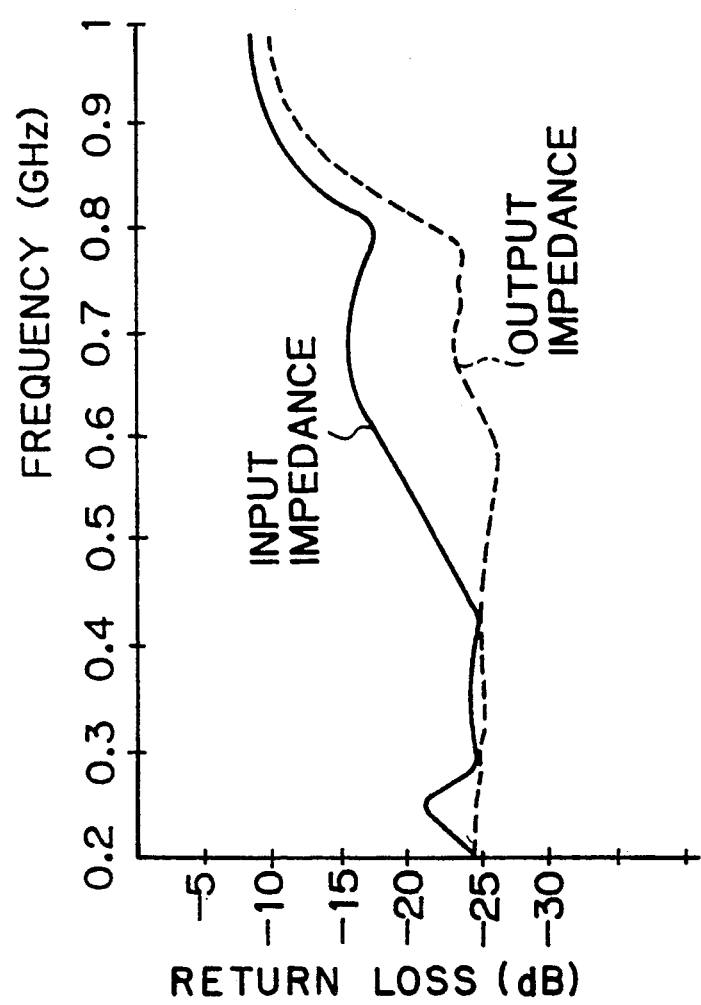
FIG. 8 is a diagram indicating characteristics of an input impedance and an output impedance of a matching improvement unit provided in a high frequency amplifier according to the present invention.

FIG. 8 is a diagram indicating the characteristics of an input impedance and an output impedance of a matching improvement unit provided in a high frequency amplifier according to the present invention. As described above, the matching improvement unit comprises two resistors $R_1$, $R_2$, two high frequency coils $L_1$, $L_2$, and three capacitors $C_1$, $C_2$, $C_3$. In FIG. 8, a solid line indicates input impedance characteristics of the matching improvement unit, or return loss characteristics at an input of the matching improvement unit, and a broken line indicates output impedance characteristics of the matching improvement unit, or return loss characteristics at an output of the matching improvement unit.

As shown in FIG. 8, a return loss of each of the input and the output impedance characteristics of the matching improvement unit are specified at over 15 dB (below $-15$ dB) in the frequency band 0.2~0.8 GHz. Namely, an impedance matching in all frequency bands including the specific high frequency band (for example, 0.8~0.9 GHz) used for the high frequency amplifier and the other frequency bands (for example, 0.2~0.8 GHz)

except for the specific high frequency band can be improved. Therefore, not only can stability of the high frequency amplification unit 1 in the specific high frequency band used for the amplifier be realized, but stability of the high frequency amplification unit 1 in the other frequency bands except for the specific high frequency band can be also realized, so that the high frequency amplifier does not oscillate and it is not damaged.

In the above description, a specific range of high frequency signals passing through the series resonant circuit including the high frequency coil $L_1$ and the capacitor $C_1$ is input into the gate terminal of the FET 1, and the specific range of high frequency signals is amplified and output by a specific amplification amount in response to an amplification operation of the FET 1.

Note, the FET 1 is driven by a bias voltage corresponding to a voltage applied to the bias supply circuit $4_1$. In this bias supply circuit $4_1$, the high frequency signals do not flow into the high potential bias terminal or the low potential bias terminal by connecting the high-frequency to ground band through the capacitor $C_2$ or $C_4$ by a low impedance.

Figure 9:
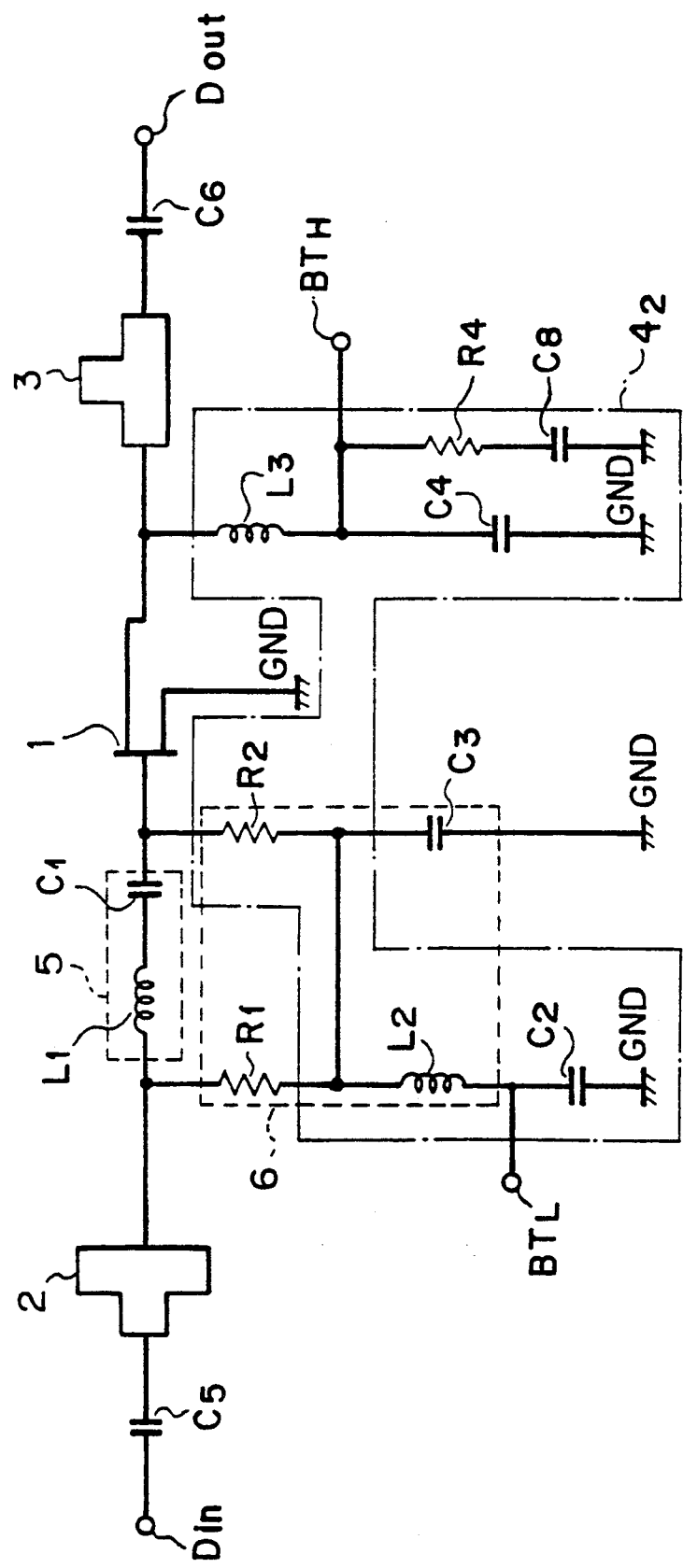
FIG. 9 is a circuit diagram illustrating a second embodiment of a high frequency amplifier according to the present invention.

FIG. 9 is a circuit diagram illustrating a second embodiment of a high frequency amplifier according to the present invention. The second embodiment of the high frequency amplifier shown in FIG. 9 has the same configuration as the first embodiment high frequency amplifier shown in FIG. 6, except for a bias supply circuit. Namely, a bias supply circuit $4_2$ of the second embodiment further comprises a resistor $R_4$ and a capacitor $C_8$. An end of the resistor $R_4$ is connected to the high potential bias terminal $BT_H$, and the other end of the resistor $R_4$ is connected to ground GND through the capacitor $C_8$. According to the above configuration, in a low frequency area, the impedance of the output terminal $D_{OUT}$ in reference to the FET 101 is also improved.

Figure 10:
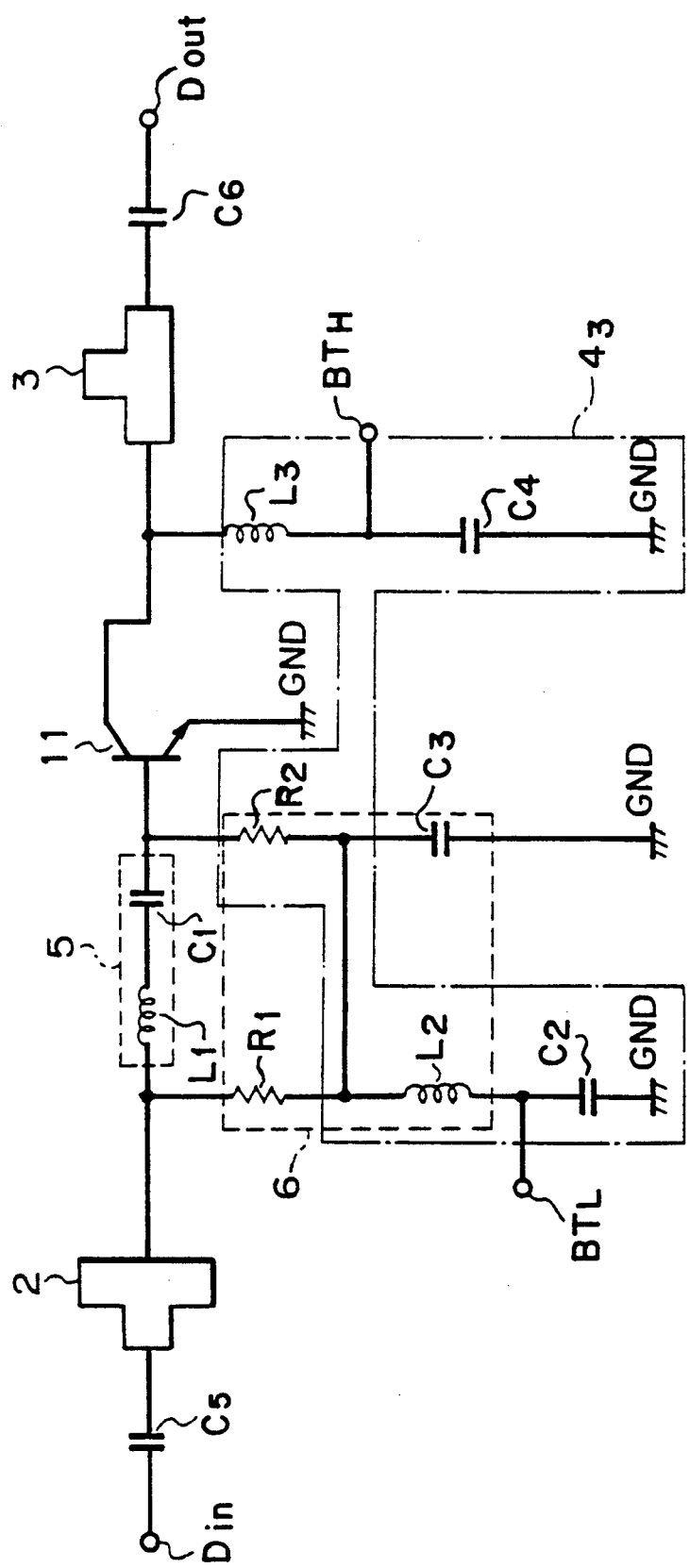
FIG. 10 is a circuit diagram illustrating a third embodiment of a high frequency amplifier according to the present invention.

FIG. 10 is a circuit diagram illustrating a third embodiment of a high frequency amplifier according to the present invention. As shown in FIG. 10, in the third embodiment of the high frequency amplifier, a bipolar transistor 11 is provided instead of the FET 1 shown in FIG. 6. The other units of the high frequency amplifier shown in FIG. 10, have the same configurations as the high frequency amplifier shown in FIG. 6.

Figure 11:
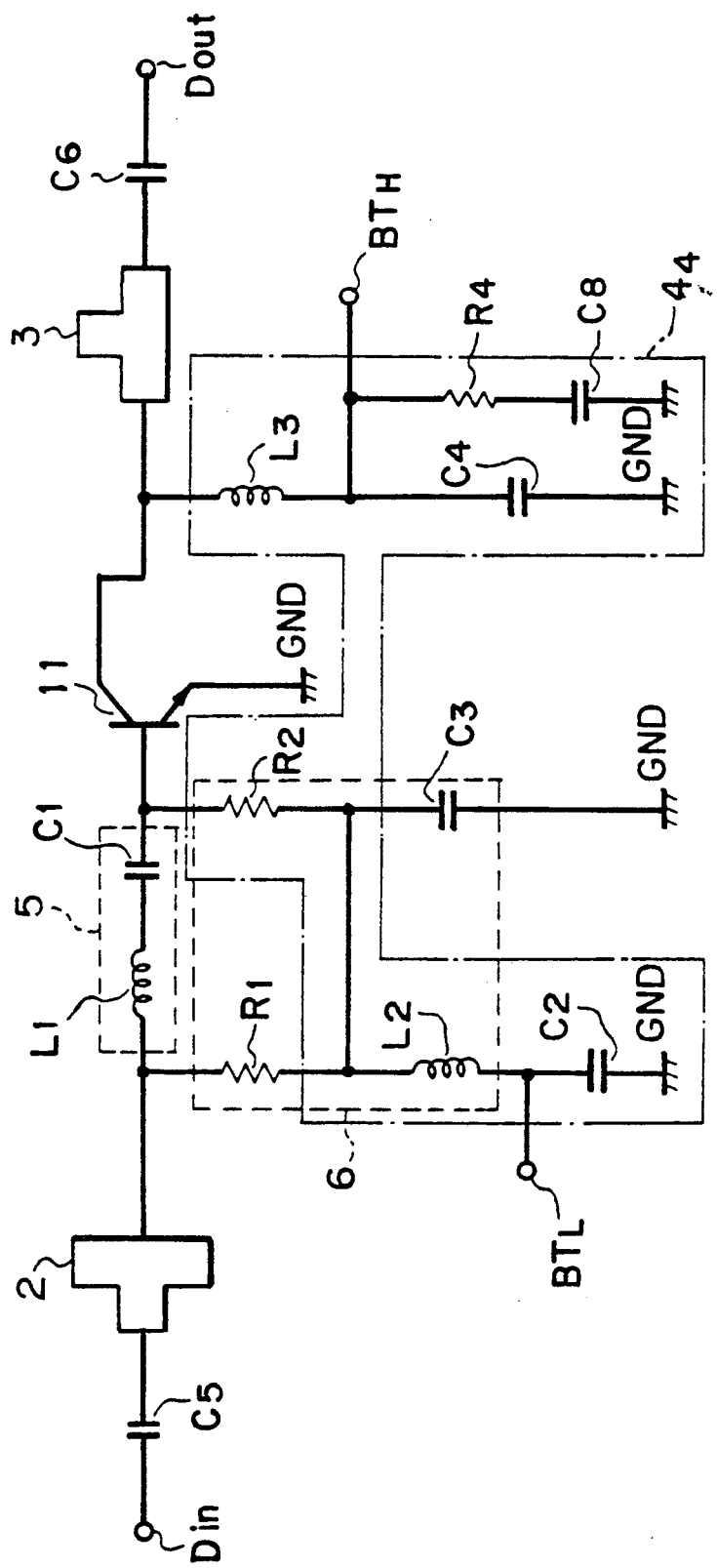
FIG. 11 is a circuit diagram illustrating a fourth embodiment of a high frequency amplifier according to the present invention.

FIG. 11 is a circuit diagram illustrating a fourth embodiment of a high frequency amplifier according to the present invention. As shown in FIG. 11, in the fourth embodiment of the high frequency amplifier, a bipolar transistor 11 is provided instead of the FET 1 shown in FIG. 9. The other units of the high frequency amplifier shown in FIG. 11, have the same configurations as the high frequency amplifier shown in FIG. 9.

As described above, in the present invention, a selection unit, which is provided at a transmission line for transferring input high frequency signals and which is connected to an input of a high frequency amplification unit, is used to pass through specific high frequency signals within a passband of the selection unit. Further, an attenuation unit, which is connected to an input of the high frequency amplification unit, is used to attenuate the input high frequency signals except for the passband of the selection unit. Therefore, the impedance of the input terminal in reference to the high frequency amplification unit for the input high frequency signals except for the passband of the selection unit, can be brought to approximately the same impedance value as at the input terminal of the amplifier, so the impedance of the amplifier is not unstable in frequency due to the physical property of the high frequency amplification unit, and so that a high frequency loss in certain specific high frequency signals can be minimized and the stability of the amplification thereof can be obtained.

Many widely differing embodiments of the present invention may be constructed without departing from the spirit and scope of the present invention, and it should be understood that the present invention is not limited to the specific embodiments described in this specification, except as defined in the appended claims.

We claim:

1. A high frequency amplifier comprising:
   an input terminal;
   an output terminal;
   a high frequency amplification means for amplifying a specific high frequency band of high frequency signals input from said input terminal;
   bias supply means, connected to said high frequency amplification means, for applying a bias potential to said high frequency amplification means, said bias supply means comprising:
   a first resistor having a first end connected to the input of said high frequency amplification means and having second end;
   first and second high frequency coils each having first and second ends; and
   first and second capacitors, said second end of said first resistor being connected to said first end of said first high frequency coil and ground through a third capacitor, said first end of said first high frequency coil being connected to said input terminal through a second resistor, said second end of said first high frequency coil being connected to a low potential bias terminal and to ground through said first capacitor, said first end of said second high frequency coil being connected to an output of said high frequency amplification means, and said second end of said second high frequency coil being connected to a high potential bias terminal and to ground through said second capacitor;
   selection means, connected between said input terminal and said high frequency amplification means, for selecting the specific high frequency band to be amplified by said high frequency amplification means from the input high frequency signals, said first resistor and said second resistor attenuate the input high frequency signals except for the specific high frequency band selected by said selection means; and
   attenuation means connected between an input of said high frequency amplification means and ground, for attenuating the input high frequency signals not selected by said selection means and including said third capacitor and said second resistor.

2. A high frequency amplifier, as claimed in claim 1, wherein said bias supply means further comprises:
   a third resistor; and
   a fourth capacitor, said third resistor and said fourth capacitor are connected in series and provided between said high potential bias terminal and ground.

3. A high frequency amplifier comprising:
   an input terminal;
   an output terminal;

a high frequency amplification means for amplifying a specific high frequency band of high frequency signals input from said input terminal;

bias supply means, connected to said high frequency amplification means, for applying a bias potential to said high frequency amplification means, and including a low potential bias terminal;

selection means connected between said input terminal and said high frequency amplification means, for selecting the specific high frequency band to be amplified by said high frequency amplification means from the input high frequency signals; and attenuation means connected between an input of said high frequency amplification means and ground, for attenuating the input high frequency signals not selected by said selection means, said attenuation means comprising:

first and second resistors;

a high frequency coil; and a capacitor, said first resistor and said high frequency coil being connected in series and provided between said input terminal and said low potential bias terminal of said bias supply means, and said second resistor and said capacitor being connected in series and provided between an input of said high frequency amplification means and ground.

* * * * *